United States Patent
Ohsawa et al.

(10) Patent No.: US 7,119,027 B2
(45) Date of Patent: Oct. 10, 2006

(54) METHOD FOR MANUFACTURING DISPLAY DEVICE THAT INCLUDES SUPPLYING SOLUTION TO THE UNDERSIDE OF A GLASS SUBSTRATE

(75) Inventors: Toshiyuki Ohsawa, Yokohama (JP); Yoichi Takahara, Yokohama (JP); Toshiki Kaneko, Chiba (JP); Daisuke Sonoda, Mobara (JP)

(73) Assignee: Hitachi Displays Ltd., Mobara (JP)

( * ) Notice: Subject to any disclaimer, the term of this patent is extended or adjusted under 35 U.S.C. 154(b) by 155 days.

(21) Appl. No.: 10/752,571

(22) Filed: Jan. 8, 2004

(65) Prior Publication Data
US 2005/0037628 A1    Feb. 17, 2005

(30) Foreign Application Priority Data
Aug. 12, 2003    (JP)    ............................. 2003-207243

(51) Int. Cl.
*H01L 21/465*    (2006.01)
*B08B 1/02*    (2006.01)

(52) U.S. Cl. ...................... 438/748; 438/756; 438/787; 134/15; 216/92

(58) Field of Classification Search ................ 438/748
See application file for complete search history.

(56) References Cited

U.S. PATENT DOCUMENTS

| | | | |
|---|---|---|---|
| 6,062,288 A | | 5/2000 | Tateyama |
| 6,290,865 B1 * | | 9/2001 | Lloyd et al. .................. 216/92 |
| 6,444,255 B1 * | | 9/2002 | Nagahara et al. ............ 427/108 |
| 6,827,814 B1 * | | 12/2004 | Taniyama et al. ....... 156/345.12 |
| 2004/0074601 A1 * | | 4/2004 | Lee et al. ............... 156/345.21 |
| 2005/0034742 A1 * | | 2/2005 | Saito et al. ..................... 134/1 |

FOREIGN PATENT DOCUMENTS

| | | |
|---|---|---|
| JP | 10079371 | 3/1998 |
| JP | 2000-228526 | 8/2000 |
| JP | 2000-303191 | 10/2000 |
| JP | 2003-092284 | 3/2003 |

OTHER PUBLICATIONS

Iso et al., "Wet Etching Treatment Method and Device," English translation of JP 10-79371 A, Japan Patent Office, patent application published on Mar. 23, 1998.*

* cited by examiner

*Primary Examiner*—Stephen W. Smoot
(74) *Attorney, Agent, or Firm*—Antonelli, Terry, Stout and Kraus, LLP.

(57)    ABSTRACT

Where a thin film formed on a glass substrate is etched with a solution containing a fluoride, insoluble residues formed by the reaction of the solution with glass substrate components adhere to the back of the substrate to cause etching non-uniformity called roller marks. So, a solution is supplied directly to supporting members for supporting the glass substrate, or concentratedly to a region where the substrate and the supporting members come into contact and from a position opposite to the transporting direction of the substrate, or to both the supporting members and regions where the substrate and the supporting members come into contact. This enables the roller marks to be kept from forming, consequently making it possible to improve display quality of display devices.

18 Claims, 10 Drawing Sheets

VIEWED FROM SIDE OF SUBSTRATE TRANSPORT DIRECTION

VIEWED FROM FRONT OF SUBSTRATE TRANSPORT DIRECTION

FIG.1A FORMATION OF SILICON OXIDE FILM AND RESIST PATTERN
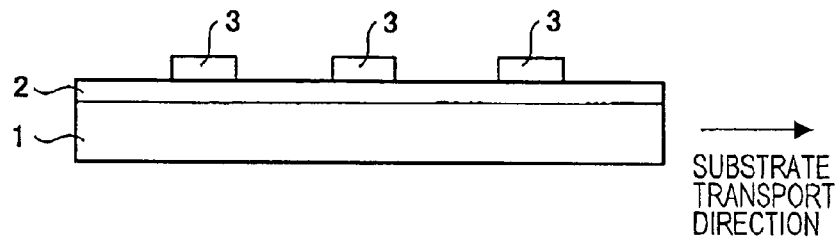
FIG.1B SUPPLY OF ETCHANT
(B-1) VIEWED FROM SIDE OF SUBSTRATE TRANSPORT DIRECTION
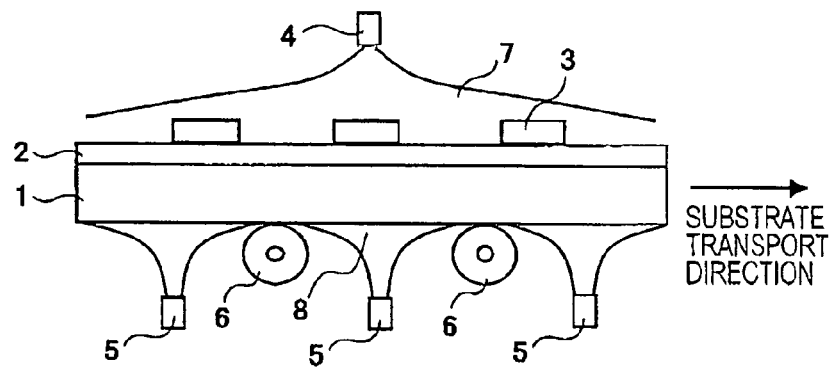
(B-2) VIEWED FROM FRONT OF SUBSTRATE TRANSPORT DIRECTION
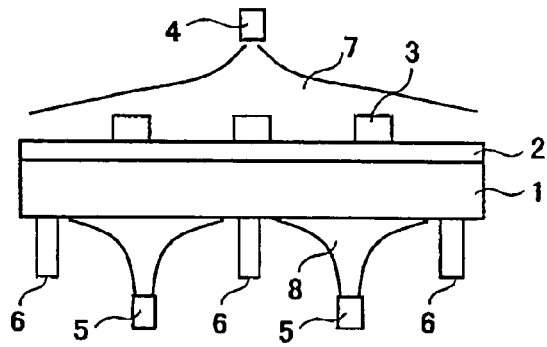
FIG.1C
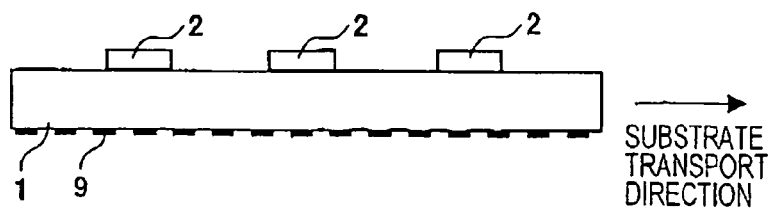

STEP MEASUREMENT POSITION

VIEWED FROM SIDE OF SUBSTRATE TRANSPORT DIRECTION

VIEWED FROM FRONT OF SUBSTRATE TRANSPORT DIRECTION

VIEWED FROM SIDE OF SUBSTRATE TRANSPORT DIRECTION

VIEWED FROM FRONT OF SUBSTRATE TRANSPORT DIRECTION

VIEWED FROM SIDE OF SUBSTRATE TRANSPORT DIRECTION

VIEWED FROM FRONT OF SUBSTRATE TRANSPORT DIRECTION

METHOD FOR MANUFACTURING DISPLAY DEVICE THAT INCLUDES SUPPLYING SOLUTION TO THE UNDERSIDE OF A GLASS SUBSTRATE

BACKGROUND OF THE INVENTION

This invention is concerned with treatment for etching or cleaning a thin film formed on a platelike glass substrate for use in flat-panel display, and more particularly relates to a method for manufacturing a display device in which marks of rollers for supporting and transporting glass substrate have been kept from forming on the back of the glass substrate, and an apparatus for manufacturing such a display device.

In general, in methods for manufacturing liquid-crystal display devices, an etching step of processing into stated shapes semiconductor films such as thin films formed on glass substrates, as exemplified by an amorphous silicon film, a polycrystalline silicon film and also a silicon oxide film, is the step of etching and removing the thin film by means of a solution, using as a mask a resist film formed on the thin film. A cleaning step is also the step of applying a solution to the thin film to remove foreign matters and contaminants present on its surface. Herein, the solution is meant to be a chemical solution used in treatment such as etching or cleaning.

The above etching step and cleaning step are treatment steps making use of solutions, and a spin system is disclosed in Japanese Patent Laid-open Publication No. 2000-228526, in which a glass substrate is rotated during which a chemical solution, pure water, nitrogen and so forth are supplied onto the glass substrate.

In the case of a large-size glass substrate such as a glass substrate having a size of 1 m×1 m, a flat-flow system is also disclosed in, e.g., Japanese Patent Laid-open Publications No. H10-79371 and No. 2000-303191, in which the glass substrate is transported onto rollers in the state of which a chemical solution, pure water and so forth are supplied onto a thin film formed on the glass substrate to carry out treatment.

In the case when the flat-flow system is used, the chemical solution used in etching or cleaning the thin film formed on the glass substrate surface comes around to the back side as well of the glass substrate, and hence the chemical solution is often so supplied as to spread as possible as uniformly to the glass substrate back side as well. Accordingly, it is common to dispose nozzles in such a way that they stay away from glass-substrate-supporting members which may block the supplying of the chemical solution.

SUMMARY OF THE INVENTION

In the art stated above, when the surface of a thin film formed on a glass substrate is treated using a solution containing chemicals, the solution comes around the back side of the glass substrate and may partly dissolve the glass itself on the back side. In particular, where the above treatment is an etching step in which a silicon-containing semiconductor film, e.g., a silicon oxide film is etched to form a pattern, a solution containing hydrofluoric acid or ammonium fluoride is used as the solution, and hence the back of the glass substrate is also etched simultaneously.

Moreover, the amount of etching on the back side of the glass substrate may differ at places, so that such differences make steps in the glass substrate. If a display device is set up thereon in such a state, the steps in the substrate may cause the scattering of light to cause a defect that the display performance comes non-uniform that is one of important characteristics required as display devices.

Accordingly, where the semiconductor film formed on the surface of a glass substrate is etched with a chemical solution, a countermeasure is devised such that a mechanism by which the solution supplied to the semiconductor film does not come around the back side of the glass substrate is provided in a treatment apparatus, or that the solution is also forcedly supplied to the back side of the glass substrate simultaneously with its supplying to the semiconductor film, to carry out uniform back etching.

However, according to the results of experiments made by the present inventors, even when the solution is supplied also to the back side of the glass substrate, etching non-uniformity called "roller marks" is formed at positions where the back of the glass substrate comes into contact with glass-substrate-supporting members, e.g., transport rollers, to cause a problem on quality as display devices.

In the present invention, the following measure is taken. When a thin film is formed on a first surface of a glass substrate and this glass substrate is so disposed that at least part of a second surface thereof comes into contact with the top of supporting member which support and transport the glass substrate, to treat in this state the thin film with use of a first solution, a second solution is supplied to the supporting member from nozzle disposed beneath the supporting member. In this case, the nozzle is positioned right beneath the supporting member and the second solution is directly supplied to the supporting member, or disposed at a position shifted from the above position in the direction of transport of the substrate so that the second solution is directly supplied through the nozzle to region where the substrate and the supporting member come into contact.

What are typified are, but not particularly limited to, that the thin film formed on the glass substrate has at least a silicon oxide film and an amorphous silicon film or polycrystalline silicon film and that the treatment of the thin film with use of the solution is the step of ethcing the silicon oxide film.

Then, the first solution and the second solution may be the solution of the same type, and may contain at least hydrogen fluoride or ammonium fluoride. Also, where the first solution and the second solution are of different types, the first solution may contain at least hydrogen fluoride or ammonium fluoride and the second solution may be pure water, for example.

As an apparatus for manufacturing the display device made up through the treatment step described above, it may comprise a transport means having supporting member which transports a glass substrate on a first surface of which a thin film has been formed, supporting the glass substrate in such a way that the supporting member comes into contact with at least part of a second surface of the glass substrate; a treatment chamber for treating the glass substrate with use of a solution; a first solution supply means which supplies a first solution with which the thin film is to be treated in the treatment chamber; and a second solution supply means which is provided on the side of the second surface of the glass substrate and supplies a second solution to the supporting member through nozzle disposed beneath the supporting member.

The first solution used to treat the thin film formed on the glass substrate may be supplied using, e.g., a shower system which is conventionally in wide use. However, the second solution is supplied by a method devised specially so that any marks of contact with the supporting member may not be made. That is, the nozzle through which the second solution is to be supplied is provided on the same side of the glass substrate as the supporting member, and is disposed right beneath the supporting member so that the second solution can directly be supplied to the supporting member. As a means which supply the second solution, the nozzle may also be disposed at position which enable the second solution to be supplied to region where the second surface of the glass substrate and the supporting member come into contact, and in the direction opposite to the direction of movement of the glass substrate. More specifically, the second solution may directly be supplied to region, where the supporting member and the second surface of the glass substrate com into contact, shifted from the position right beneath the supporting member in the direction of transport of the substrate.

In a further embodiment, nozzle through which the second solution is to be supplied may be disposed on side of the second surface of the glass substrate, between supporting members provided in the direction of transport of the glass substrate or in the direction falling at right angles with the transport direction so that the second solution supplied through the nozzle can directly be supplied to the region where the substrate and the supporting members come into contact.

The distance between supporting member and nozzle or the distance between region where the supporting member and the glass substrate come into contact and nozzle may be set within the range of from 5 mm to 100 mm. In either case, the flow rate of the second solution may be changed within the range of from 0.3 liter to 5 liters per minute for each nozzle.

In the case when the thin film formed on the glass substrate is treated with use of the solution containing chemicals as described above, the "roller marks" can be kept from forming, by supplying the chemical solution around the supporting member coming into contact with the back of the glass substrate. This enables production of display devices making use of glass sheets as substrates, such as liquid-crystal display devices and self-luminous display devices, without any lowering of the display quality that is a typical characteristic the display devices must have.

BRIEF DESCRIPTION OF THE DRAWINGS

These and other features, objects and advantages of the present invention will become more apparent from the following description when taken in conjunction with the accompanying drawings wherein:

FIGS. 1A to 1C illustrate a mechanism by which roller marks form on the back of a glass substrate.

DETAILED DESCRIPTION OF PREFERRED EMBODIMENTS

Figure 2A:
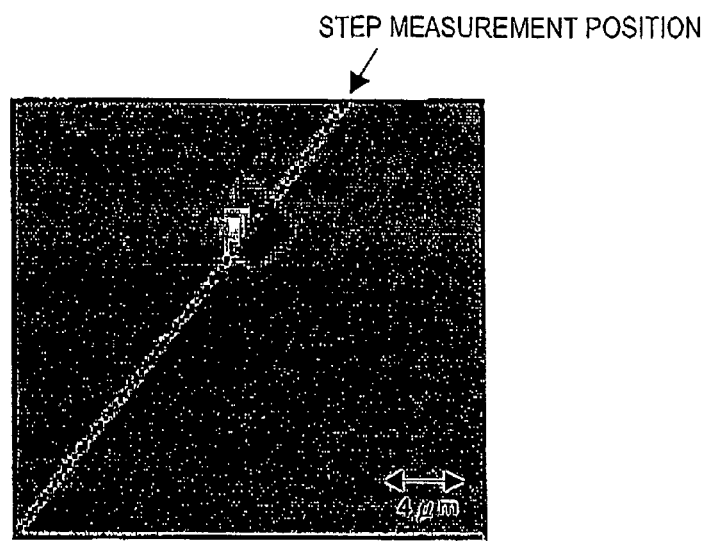
FIGS. 2A and 2B illustrate the shape of a roller mark which forms when the glass substrate is etched.

Before specific embodiments of the present invention are described, a mechanism is explained by which the roller marks form in the above-mentioned etching step making use of a solution.

FIGS. 1A to 1C show an experiment procedure for examining how the roller marks form. Here, the thin film to be treated with a solution is a silicon oxide film, but is not limited to the silicon oxide film as long as the glass substrate itself is also etched as a result of such treatment.

First, a glass substrate 1 on the surface of which a silicon oxide film 2 and a resist pattern 3 have been formed as shown in FIG. 1A is put into an etching apparatus. Next, in order to etch the silicon oxide film 2 using the resist pattern 3 as a mask as shown in FIG. 1B, an etchant 7 (a first solution) containing at least hydrogen fluoride or ammonium fluoride is supplied to the face side of the glass substrate 1 through a nozzle 4.

Here, the same solution 8 (a second solution as the above etchant 7 is also supplied to the back side of the glass substrate 1 through nozzles 5. However, the method of supplying the second solution 8 is not a method which is conventionally in wide use and in which the disposition of the nozzle 5 and the supply rate of the solution 8 are made optimum so that uniform etching can be carried out and the second solution 8 is especially concentratedly supplied to supporting members 6 for supporting the glass substrate 1.

Thereafter, the resist pattern 3 is removed, and the etching of the silicon oxide film 2 is completed as shown in FIG. 1C. Incidentally, not shown in the drawing, the steps of cleaning with pure water and drying after the etching has been completed are carried out by conventionally well known methods, and are omitted to illustrate them.

In detailed observation of the glass substrate 1 having been treated by the above method, etching non-uniformity 9 caused by the second solution (the same solution as the first solution) is seen on the back of the glass substrate 1. Moreover, the etching non-uniformity 9 is conspicuous in regions where the back of the glass substrate 1 and the supporting members 6 (in this case, rollers of about 10 mm each in width are used) come into contact. Hereinafter, marks of this non-uniformity are called roller marks 9.

To investigate the mechanism of formation of such roller marks 9, the second solution supplied to the back side of the glass substrate 1 has been collected, and residues in that solution have been analyzed with an energy dispersive X-ray spectroscope manufactured by Hitachi Ltd. As the result, from spectra detected, it has been found that the residues in the second solution are fluorides of aluminum, calcium, strontium, magnesium and so forth which are components of the glass substrate 1.

From this fact, the mechanism of formation of the roller marks 9 is presumed as follows: The second solution (here, containing hydrogen fluoride or ammonium fluoride) supplied to the back side of the glass substrate 1 etches the glass itself though it does slightly. At this point, a glass component silicon dissolves in the second solution in the form of silicon fluoride. However, the fluorides of aluminum, calcium, strontium, magnesium and so forth revealed as a result of the analysis have so small solubility that they float in the second solution to come to adhere to the supporting member 6 rollers later, and those having adhered thereto are transferred to the back of the glass substrate 1 at the time of its transport.

While the silicon oxide film 2 is etched, the back of the glass substrate 1 is also etched having the above fluorides act as masks, and further the insoluble fluorides having adhered to the back of the glass substrate 1 are removed in the cleaning step after the etching has been completed. Hence, regions where the fluorides have acted as masks are not etched on the back of the glass substrate 1, so that protuberances standing convex remain there.

Figure 2B:
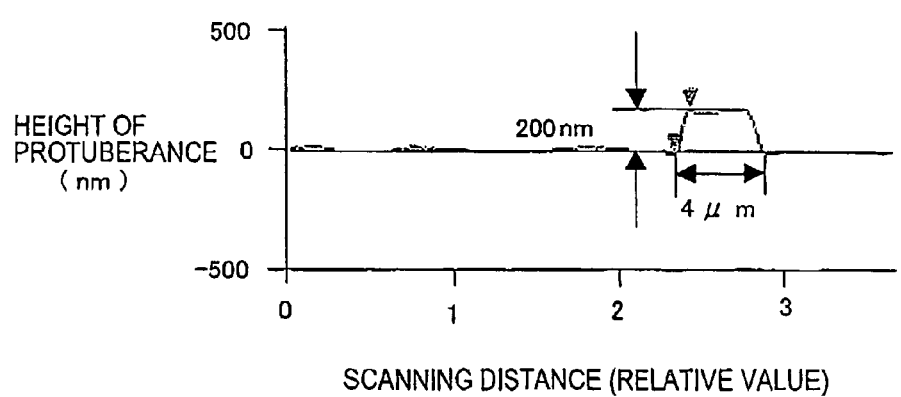

FIGS. 2A and 2B show the results of examination of the above protuberances on the back of the glass substrate 1. FIG. 2A is an optical microscope photograph of a protuberance, and FIG. 2B shows a profile obtained by measuring the protuberance with a step height meter at a position crossing the protuberance. From this result, the protuberance has been found to be a step of about 200 nm in height and have the shape of a rectangular column or a pyramid of few micrometers in each side.

Then, the above protuberances are made only in the regions where the supporting members rollers have passed. Thus, the insoluble residues causative of the etching non-uniformity on the back of the glass substrate have proved to be transferred to the back of the glass substrate through the rollers. The roller marks may also form by a like mechanism even in the cleaning step making use of the solution.

From the foregoing, in order to keep the protuberances from forming in the regions on the glass substrate back with which the rollers have come into contact, i.e., to prevent the roller marks from forming, it is considered effective that the fluorides having adhered to the supporting members 6 rollers are dropped away before they are transferred to the back of the glass substrate, or that they are removed immediately after they have adhered to the back of the glass substrate.

How to prevent the insoluble residues causative of the roller marks from being transferred to the glass substrate is described below.

Figure 3A:
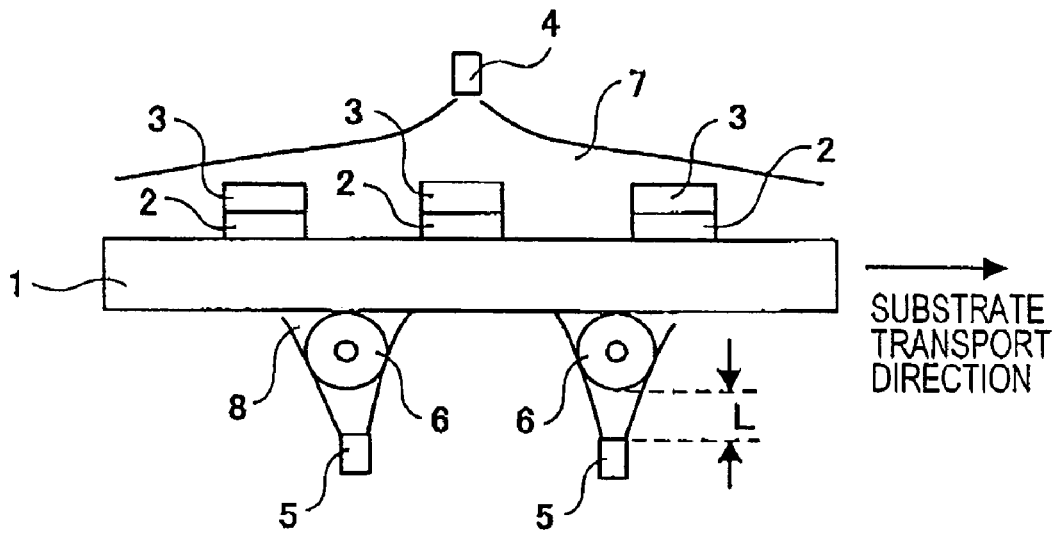
FIGS. 3A and 3B illustrate an embodiment of the present invention.
Figure 3B:
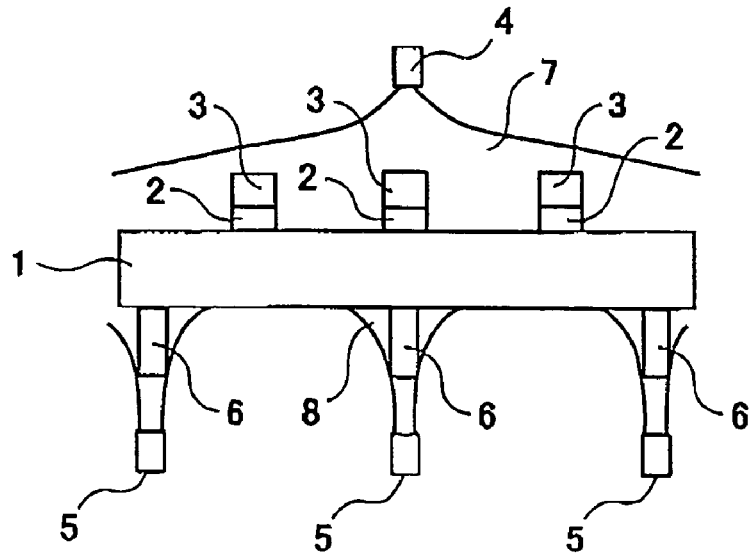

FIGS. 3A and 3B illustrate a method by which the second solution 8 is supplied to the back (the side on which any thin film is not formed) of the glass substrate 1. The thin film formed on the face of the glass substrate 1 and how to etch it are the same as those in the case shown in FIGS. 1A to 1C. Then, as for the method by which the second solution 8 is supplied on the back side of the glass substrate 1, the positional relationship between rollers 6 and nozzles 5 is so set that the second solution 8 can more directly be jetted from the nozzles 5 to the rollers which are supporting members 6 for transporting the glass substrate 1.

Stated specifically, the nozzles 5 are disposed at positions right beneath the rollers 6, and the flow rate of the second solution jetted from each nozzle 5 and the distance between each nozzle 5 and each supporting member 6 are changed (the former being within the range of from 0.3 liter to 5 liters/minute per nozzle, and the latter being within the range of from 5 mm to 100 mm).

Figure 4A:
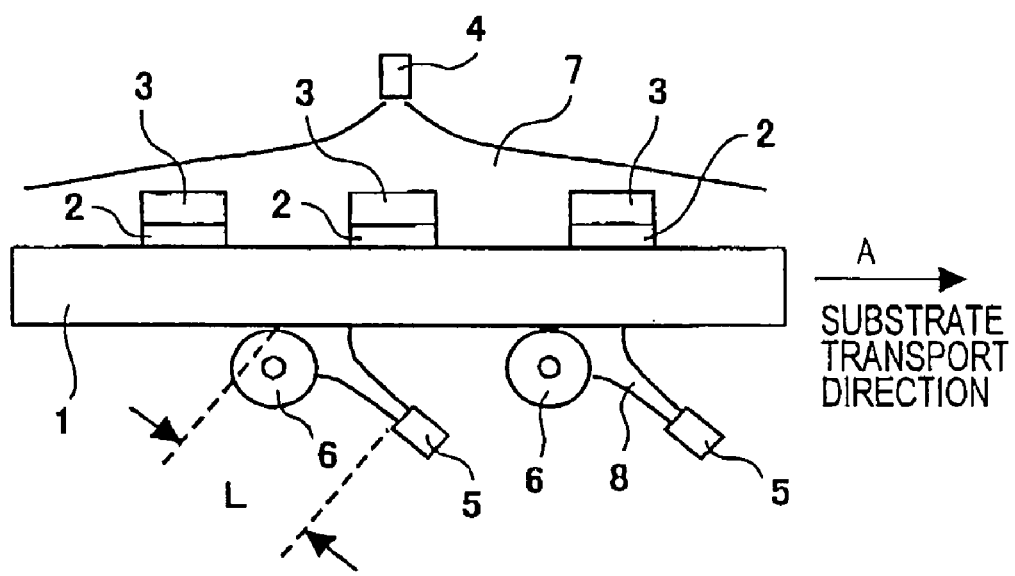
FIGS. 4A and 4B illustrate another embodiment of the present invention.
Figure 4B:
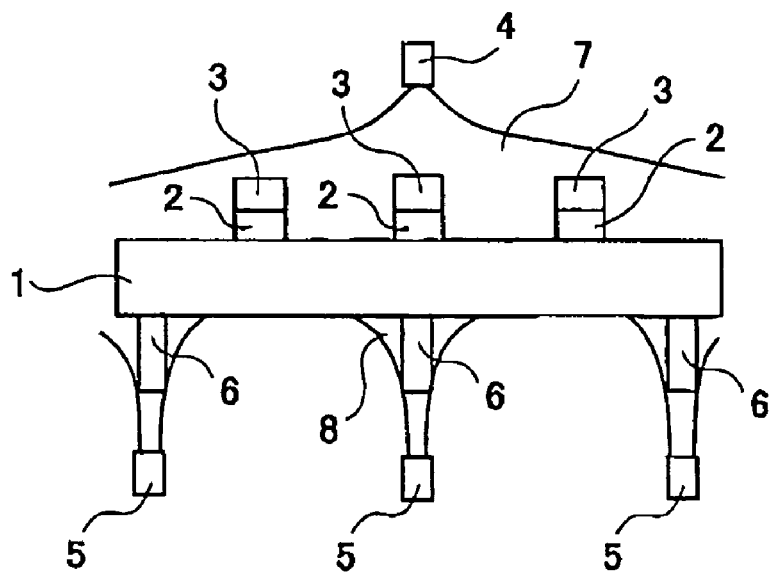

FIGS. 4A and 4B illustrate a solution-supplying method different from that shown in FIGS. 3A and 3B. In order to immediately remove the insoluble residues having adhered to the back of the glass substrate 1, nozzles 5 so disposed (at intervals of 5 to 100 mm) that the second solution 8 is supplied to regions where supporting members 6 and the glass substrate 1 come into contact, and in the direction opposite to the glass substrate 1 transport direction (the direction shown by an arrow A in FIG. 4A). Stated specifically, the nozzles 5 are disposed at positions shifted from the positions right beneath the rollers 6 in the direction A of transport of the substrate 1, in order that the second solution is supplied through nozzles to regions where the substrate 1 and the rollers 6 come into contact. The flow rate of the second solution is changed within the range of from 0.3 liter to 5 liters per minute for each nozzle.

Figure 5A:
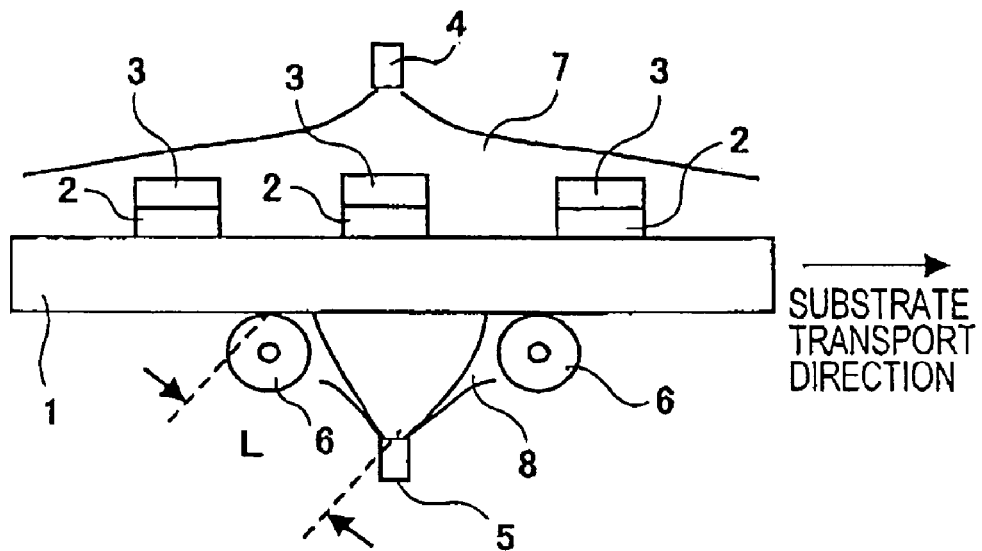
FIGS. 5A and 5B illustrate still another embodiment of the present invention.
Figure 5B:
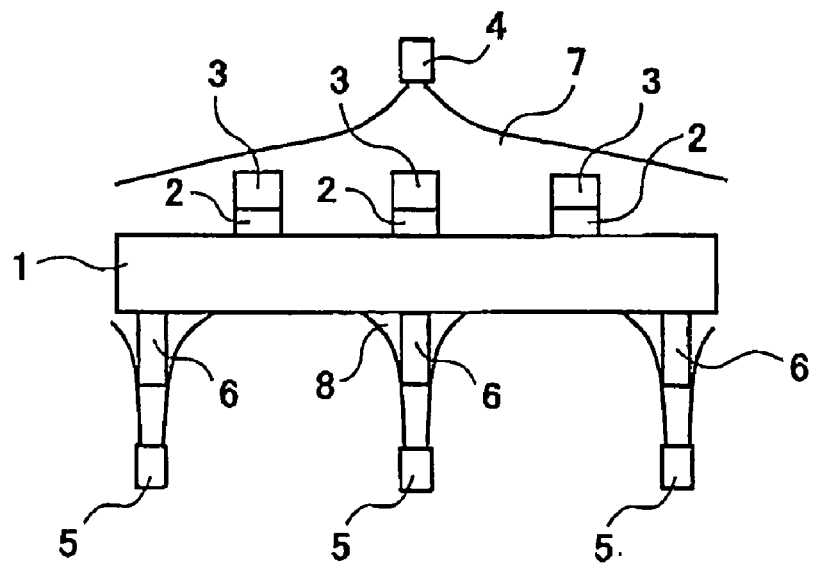

FIGS. 5A and 5B illustrate a solution-supplying method further different from the case shown in FIGS. 3A and 3B or FIGS. 4A and 4B. What differs from the case shown in FIGS. 4A and 4B is that the second solution 8 jetted from nozzles 5 is supplied to regions where adjacent supporting members 6 each come into contact with the back of the glass substrate 1.

In the case shown in FIGS. 5A and 5B, what are targeted are rollers 6 which are adjacent to one another in the direction of transport of the substrate 1. What may also be targeted are rollers 6 which are disposed in the direction at right angles with the direction of transport of the substrate 1 (see disposition shown in FIG. 5B). In any of these cases, orifices of the nozzles are each so provided that the second solution 8 is jetted in two directions from one nozzle. The distance between each nozzle 5 and each roller 6 is changed within the range of from 5 mm to 100 mm, and also the flow rate of the second solution within the range of from 0.3 liter to 5 liters per minute for each nozzle.

Thus, in any of the cases shown in FIGS. 3A and 3B, FIGS. 4A and 4B and FIGS. 5A and 5B, it has been turned out that the insoluble residues can effectively be prevented from adhering to the supporting members 6, as long as the flow rate of the second solution and the distance between each roller 6 and each nozzle 5 are within the above ranges. It has also been turned out that the residues having adhered to the back of the glass substrate can also effectively be removed and consequently no roller marks are seen. In particular, in the case shown in FIGS. 5A and 5B, it has been turned out that the same effect is obtainable though the number of necessary nozzles is halved compared with the case shown in FIGS. 4A and 4B.

Incidentally, if the distance between the supporting member and the nozzle is 100 mm or more and the flow rate of the second solution is less than 0.3 liter/minute, the flow velocity of the solution jetted is so small as to lower the effect of removing the residues. Also, if the distance between the supporting member and the nozzle is less than 5 mm, the regions where the second solution is supplied are so narrow as to make the treatment inefficient. Then, if the flow rate of the second solution is 5 liters/minute or more, the flow rate used in the whole apparatus come to be 500 to 1,000 liters/minute because usually hundred to two-hundred supporting members are disposed per apparatus. This requires a large-scale solution supply equipment, and is not practical.

The present invention is described below in greater detail by giving Examples and with reference to drawings.

EXAMPLE 1

Figure 11:
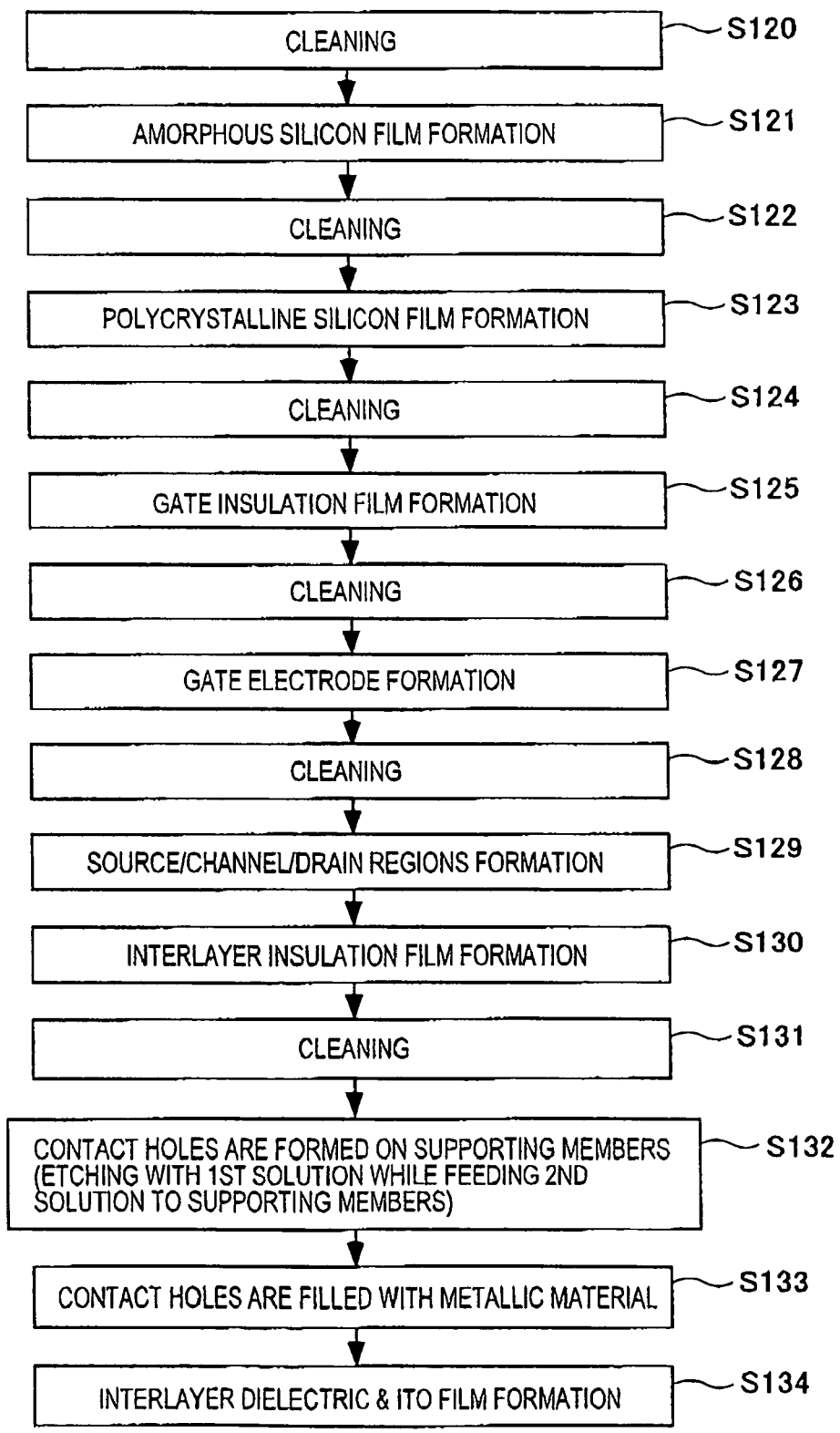
FIGS. 11 and 12 are flow charts of the steps of manufacturing display devices according to embodiments of the present invention.

FIGS. 6A to 6D schematically illustrate the steps of manufacturing a polycrystalline TFT (thin-film transistor) used in liquid-crystal display devices. FIG. 11 is a flow chart of its manufacturing steps.

Figure 6A:
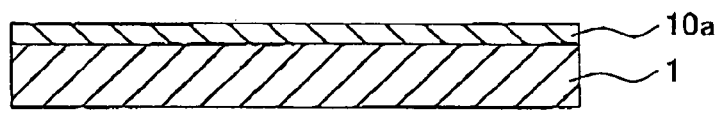
FIGS. 6A to 6D are a flow sheet for illustrating the steps of manufacturing a polycrystalline TFT device.

First, as shown in FIG. 6A, on a glass substrate 1 having been cleaned in a cleaning step (S120), an amorphous silicon film 10a (layer thickness: 10 to 100 nm) is formed by a well known process CVD (chemical vapor deposition) (S121). Thereafter, the amorphous silicon film 10a is cleaned (S122)

This amorphous silicon film 10a is crystallized by means of an excimer laser or the like to form a polycrystalline silicon film 10b (S123), and the substrate is cleaned (S124).

Figure 6B:
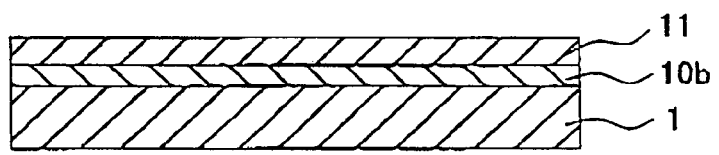

Next, as shown in FIG. 6B, the polycrystalline silicon film 10b is worked in a predetermined size, and thereafter, on this polycrystalline silicon film 10b, a gate insulation film 11 (silicon oxide film of about 100 nm in layer thickness) is formed by a well known process, e.g., plasma TEOS (Tetraethyl Orthosilicate) CVD (Chemical Vapor Deposition) (125), and the substrate is cleaned (S126).

Figure 6C:
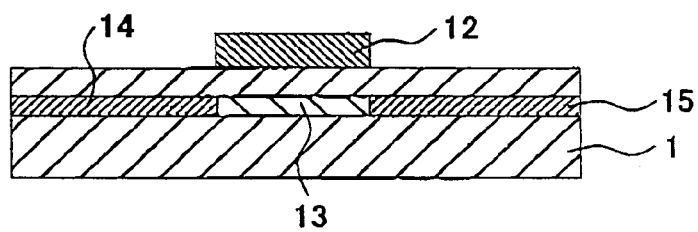

Then, as shown in FIG. 6C, a gate electrode 12 having been patterned is formed on the gate insulation film 11 (S127), and thereafter the substrate is cleaned (S128). Thereafter, using this gate electrode 12 as a mask, ion implantation is carried out on the polycrystalline silicon film 10b to form a source region 14, a channel region 13 and a drain region 15 (S129).

Figure 6D:
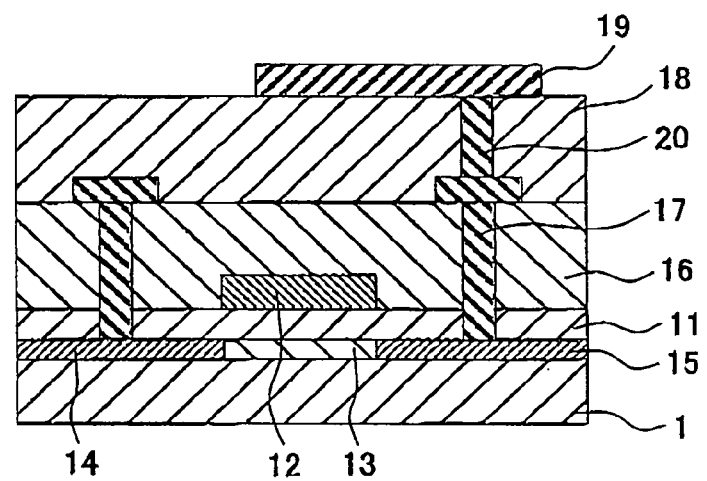

Thereafter, as shown in FIG. 6D, on the gate insulation film 11 including the gate electrode 12, an interlayer insulation film 16 (e.g., a plasma TEOS film of 500 nm in layer thickness) is formed (S130), and then the substrate is cleaned (S131). Thereafter, this substrate with films is placed on the supporting members 6, where contact holes 17 are formed by etching with the solution containing a chemical solution (S132). Thereafter, a metallic material is buried in the contact holes 17 to effect electrical connection between the source region 14 and the drain region 15 (S133). Then, an interlayer insulation film 18 (e.g., a silicon nitride film of 500 nm in layer thickness) and an ITO (indium-tin oxide) electrode 19 are further formed to complete the polycrystalline TFT (S134).

Here, as the gate insulation film 11 and the interlayer insulation film 16, silicon exide films are often used which is formed by the well known process plasma TEOS CVD. Then, when the contact holes are formed in these layers by a wet process, the etchant containing hydrogen fluoride or ammonium fluoride is used. The present invention described above was applied to this step.

Figure 7:
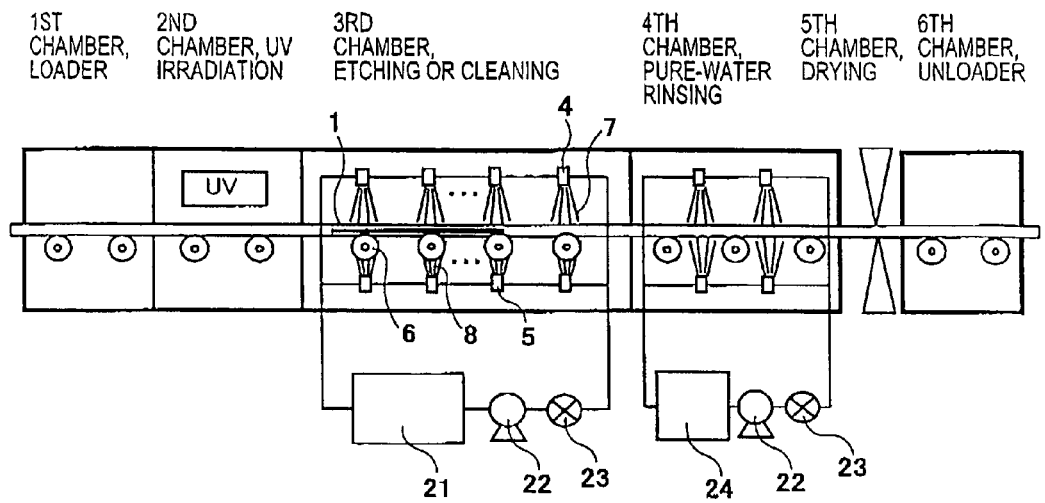
FIG. 7 illustrates an outline of a manufacturing apparatus of the present invention.

FIG. 7 illustrates an outline of a treating apparatus for carrying out the above etching. A substrate of 730×920 mm$^2$ is used as the glass substrate 1. A first chamber is a loader section, where the glass substrate 1 is transported on the supporting members 6 (in this case, rollers are used) by a flat-flow system. A second chamber is a section in which the substrate surface is irradiated with ultraviolet rays by means of an excimer UV lamp, where organic contaminants on the glass substrate 1 are removed.

Then, a third chamber is an etching chamber, where the first solution 7 is pumped from a solution tank 21 by a pump 22, which is passed through a filter 23 and thereafter supplied through nozzles 4 to the thin film (not shown; in this case, a silicon oxide film) formed on the glass substrate 1, whereby the thin film is etched. At this point, the second solution 8 is pumped from the solution tank 21 to the back side as well of the glass substrate 1 by the pump 22, which is passed through the filter 23 and thereafter supplied through nozzles 5 to make any insoluble residues not adhere to the glass substrate back side. In the apparatus shown in FIG. 7, the nozzles 5 are disposed in the same manner as those shown in FIGS. 3A and 3B, which are so disposed that the second solution 8 can more directly be jetted to the rollers which are supporting members 6.

A fourth chamber defines a cleaning region for removing the etchants (first solution and second solution) used in the third chamber, where pure water is pumped from a pure-water tank 24 by the pump 22, passed through a filter 23 and thereafter supplied to a sprayer BUBBLE JET (registered trademark in Japan) to carry out cleaning. A fifth chamber is an air-knife chamber for drying, and a sixth chamber is an unloader section.

Here, as to the number of the nozzles 5 in the third chamber, twenty nozzles were evenly arranged in the longitudinal direciton (transport direction) of the substrate and also five nozzles were evenly arranged in the lateral direction (hundred nozzles in total) the whole area of each glass substrate 1. Also, the distance between each nozzle 5 and each roller 6 and the flow rate of the second solution per nozzle 5 were changed within the ranges of 2 to 130 mm and from 0.1 to 7 liters/minute, respectively, with reference to the results of examination shown in relation to FIGS. 3A and 3B, where whether or not the roller marks formed was visually observed by means of a well known floodlighting projector. Then, the results were evaluated as OK (judgement: "A") when the number of roller marks observed on the back of the glass substrate (730×920 mm$^2$) was zero, and NG (judgement: "C") when one or more roller marks were observed without regard to length. Incidentally, as a comparative example, nozzles were disposed at positions as shown in FIG. 1A to 1C to carry out treatment in the state the second solution was not directly supplied to supporting members.

Results of the foregoing are shown together in Table 1.

TABLE 1

Relationship between Solution Supply Method and Roller Marks

| | Etching conditions | | (1) Example 1 Solution is supplied to rollers. | | (2) Example 2 Solution is supplied to substrate/roller portions. | | (3) Example 3 Solution is supplied to substrate/roller portions. (number of | |
|---|---|---|---|---|---|---|---|---|
| No. | Nozzle-to-roller distance (mm) | Flow rate per nozzle (lit/min) | Roller marks (lines/subst rate) | Judgement | Roller marks (lines/subst rate) | Judgement | Roller marks (lines/subst rate) | Judgement |
| 1 | 2 | 0.1 | >10 | X | >10 | X | >10 | X |
| 2 | 2 | 0.3 | >10 | X | >10 | X | >10 | X |
| 3 | 2 | 1 | >10 | X | >10 | X | >10 | X |
| 4 | 2 | 3 | 6 | X | 8 | X | >10 | X |
| 5 | 2 | 7 | 3 | X | 5 | X | 6 | X |
| 6 | 5 | 0.1 | 5 | X | 6 | X | >10 | X |

TABLE 1-continued

Relationship between Solution Supply Method and Roller Marks

| | Etching conditions | | (1) Example 1 Solution is supplied to rollers. | | (2) Example 2 Solution is supplied to substrate/roller portions. | | (3) Example 3 Solution is supplied to substrate/roller portions. (number of | |
|---|---|---|---|---|---|---|---|---|
| No. | Nozzle-to-roller distance (mm) | Flow rate per nozzle (lit/min) | Roller marks (lines/subst rate) | Judgement | Roller marks (lines/subst rate) | Judgement | Roller marks (lines/subst rate) | Judgement |
| 7 | 5 | 0.3 | 0 | ○ | 0 | ○ | 0 | ○ |
| 8 | 5 | 1 | 0 | ○ | 0 | ○ | 0 | ○ |
| 9 | 5 | 3 | 0 | ○ | 0 | ○ | 0 | ○ |
| 10 | 5 | 5 | 0 | ○ | 0 | ○ | 0 | ○ |
| 11 | 5 | 7 | 0 | ○ | 0 | ○ | 0 | ○ |
| 12 | 10 | 0.1 | 8 | X | 9 | X | >10 | X |
| 13 | 10 | 0.3 | 0 | ○ | 0 | ○ | 0 | ○ |
| 14 | 10 | 1 | 0 | ○ | 0 | ○ | 0 | ○ |
| 15 | 10 | 3 | 0 | ○ | 0 | ○ | 0 | ○ |
| 16 | 10 | 5 | 0 | ○ | 0 | ○ | 0 | ○ |
| 17 | 10 | 7 | 0 | ○ | 0 | ○ | 0 | ○ |
| 18 | 30 | 0.1 | >10 | X | >10 | X | >10 | X |
| 19 | 30 | 0.3 | 0 | ○ | 0 | ○ | 0 | ○ |
| 20 | 30 | 1 | 0 | ○ | 0 | ○ | 0 | ○ |
| 21 | 30 | 3 | 0 | ○ | 0 | ○ | 0 | ○ |
| 22 | 30 | 5 | 0 | ○ | 0 | ○ | 0 | ○ |
| 23 | 30 | 7 | 0 | ○ | 0 | ○ | 0 | ○ |
| 24 | 50 | 0.1 | >10 | X | >10 | X | >10 | X |
| 25 | 50 | 0.3 | 0 | ○ | 0 | ○ | 0 | ○ |
| 26 | 50 | 1 | 0 | ○ | 0 | ○ | 0 | ○ |
| 27 | 50 | 3 | 0 | ○ | 0 | ○ | 0 | ○ |
| 28 | 50 | 5 | 0 | ○ | 0 | ○ | 0 | ○ |
| 29 | 50 | 7 | 0 | ○ | 0 | ○ | 2 | ○ |
| 30 | 100 | 0.1 | >10 | X | >10 | X | >10 | X |
| 31 | 100 | 0.3 | 0 | ○ | 0 | ○ | 0 | ○ |
| 32 | 100 | 1 | 0 | ○ | 0 | ○ | 0 | ○ |
| 33 | 100 | 3 | 0 | ○ | 0 | ○ | 0 | ○ |
| 34 | 100 | 5 | 0 | ○ | 0 | ○ | 0 | ○ |
| 35 | 100 | 7 | 0 | ○ | 0 | ○ | 0 | ○ |
| 36 | 130 | 0.1 | >10 | X | >10 | X | >10 | X |
| 37 | 130 | 0.3 | 8 | X | >10 | X | >10 | X |
| 38 | 130 | 1 | 7 | X | 7 | X | 10 | X |
| 39 | 130 | 3 | 5 | X | 6 | X | 8 | X |
| 40 | 130 | 7 | 4 | X | 4 | X | 6 | X |
| Comparative example | 30 | 3 | — | — | >10 | X | >10 | X |

As is evident from item (1) in Table 1, like the results of experiment shown in FIGS. 3A and 3B, the number of roller marks on the back of the glass substrate is seen to be zero as long as the distance between each nozzle 5 and each transport roller 6 is within the ranges of from 5 mm to 100 mm and the flow rate of the second solution per nozzle is within the range of from 0.3 liter to 5 liters per minute. Then, when liquid-crystal display devices were manufactured using glass substrates kept in such a state, none of the substrates affected display performance adversely.

Incidentally, where the distance between each nozzle 5 and each transport roller 6 and the flow rate of the second solution per nozzle were out of the above ranges, the number of roller marks having formed increased sharply. Also, where the second solution was not positively supplied to the supporting members as in comparative example, it has been proved to be very difficult to remove the insoluble residues from the back of the substrate.

By the way, in the above experiment, the second solution is supplied to the back of the glass substrate through nozzles in the form of showers. Instead, it may be supplied in the form of curtains by using slit-shaped nozzles.

EXAMPLE 2

The glass substrate used in etching, the thin film to be treated, the etching apparatus and the etching conditions are the same as those in Example 1. What differs from Example 1 is the method of supplying the second solution, and the method shown in FIGS. 4A and 4B is used in this Example 2.

Figure 12:
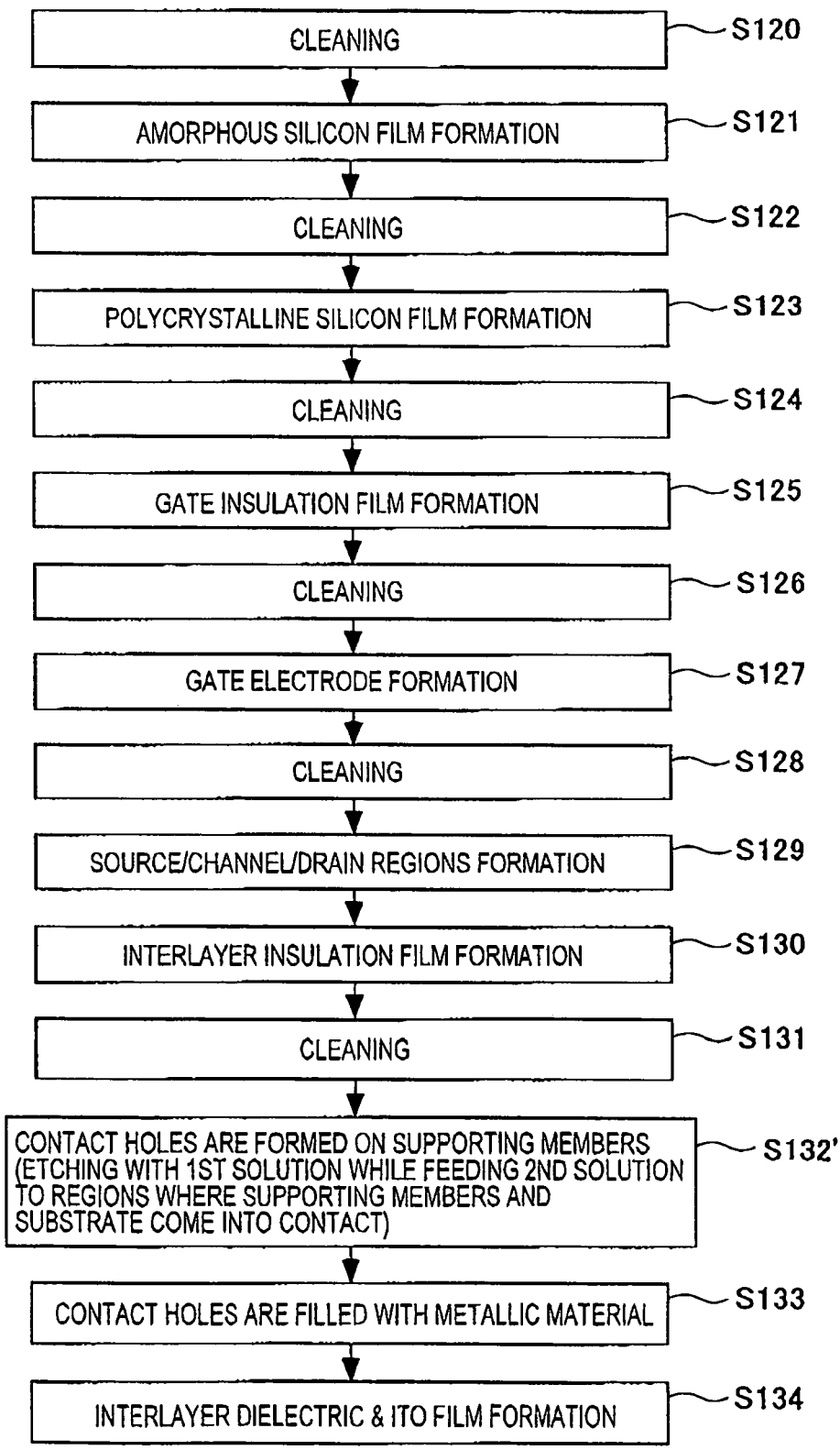

That is, as shown in FIG. 12, in the step of forming contact holes (S132'), in order to immediately remove the insoluble residues having adhered to the back of the glass substrate 1, the apparatus is so set that the second solution is supplied through nozzles so disposed that the second solution 8 is jetted to regions where the supporting members 6 and the back (the side on which no thin film is formed) of the glass substrate 1 come into contact, and in the direction opposite to the glass substrate 1 transport direction (the direction shown by an arrow A in FIG. 4A).

Results of the foregoing are shown together in item (2) in Table 1. Like the case of Example 1, it was able to keep the roller marks from forming, by removing the insoluble residues immediately if they had been transferred from the transport rollers to the back of the glass substrate.

EXAMPLE 3

The glass substrate used in etching, the thin film to be treated, the etching apparatus and the etching conditions are the same as those in Example 1. What differs from Example 1 is the method of supplying the second solution, and the method shown in FIGS. 5A and 5B are used in this Example 3. That is, the nozzles 5, which are positioned below the supporting members 6, are disposed between supporting members 6 adjacent to one another in the direction of transport of the glass substrate 1. Then, as shown in FIG. 12, in the step of forming contact holes (S132'), the apparatus is so set that the second solution jetted from the nozzles 5 is supplied to regions where adjacent supporting members 6 each come into contact with the back of the glass substrate 1. The position of each nozzle 5 disposed between adjacent two supporting members 6 (the distance between the nozzle and each supporting member is 5 to 100 mm) may preferably be the middle of the two supporting members.

Results of the foregoing are shown together in item (3) in Table 1. Like the case of Example 2, it was able to keep the roller marks from forming, by removing the insoluble residues immediately if they had been transferred from the transport rollers to the back of the glass substrate. Also, the same effect was obtainable, the number of nozzles was a half of the case of Example 2. Hence it has been proved that the flow rate of the second solution can be halved.

EXAMPLE 4

What differs from Example 1 is that the first solution (hydrogen fluoride or ammonium fluoride solution) used to etch the silicon oxide film formed on the glass substrate differs from the second solution to be supplied to the supporting members on the back of the glass substrate. Stated specifically, pure water is used as the second solution.

Figure 8:
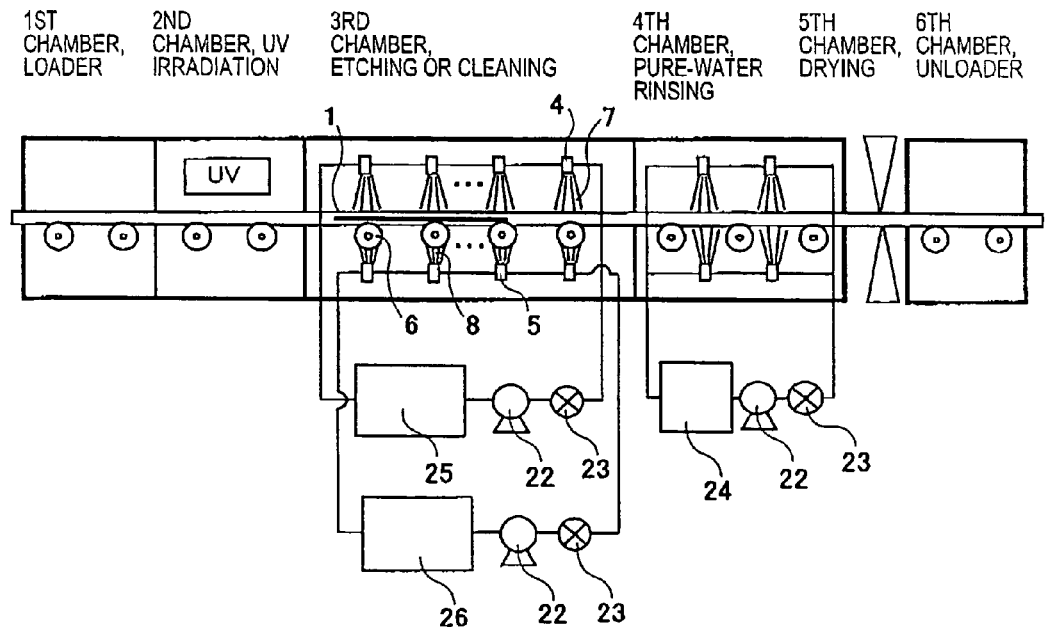
FIG. 8 illustrates an outline of another manufacturing apparatus of the present invention.

To materialize this, an apparatus shown in FIG. 8 was used as an etching apparatus. What differs from the apparatus in Example 1 is that supplying means such as solution tanks, pumps, filters and so forth are provided which are exclusively used for each of the first solution (hydrogen fluoride or ammonium fluoride solution) and the second solution (pure water) to be supplied to the supporting members on the back of the glass substrate. Ethcing conditions and so forth are the same as those in Example 1.

As the result, like the case of Example 1, the insoluble residues, which are formed when the first solution supplied to the face side of the glass substrate come around the substrate back side to etch part of the substrate, can effectively be removed by supplying pure water directly and positively to the supporting members rollers.

The number of roller marks on the back of the glass substrate is zero as long as the distance between each nozzle 5 and each transport roller 6 is within the range of from 5 mm to 100 mm and the flow rate of the second solution per nozzle is within the range of from 0.3 liter to 5 liters per minute.

EXAMPLE 5

The method described in Example 1 is applied to the step of forming contact holes 20 that is taken after the interlayer insulation film 18 is formed. The types of the first and second solutions, the method for supplying them, the conditions for supplying them, and so forth are the same as those in Example 1.

As the result, it has been proved that substantially the same effect as in the case described in Example 1 is obtained.

EXAMPLE 6

The method described in Example 1 is applied to the glass substrate 1 standing before the thin film is formed thereon, i.e., to the step of cleaning the glass substrate itself. (S120). For example, Hydrogen fluoride water is used as the first solution and the second solution to be supplied to the face side of the glass substrate and to the supporting members on its back side. The apparatus described with reference to FIG. 7 is used to carry out cleaning.

As the result, at the stage of substrate cleaning as well, the insoluble residues are formed as long as a solution which dissolves glass itself is used. However, it is possible to prevent the roller marks from forming, as long as the insoluble residues are removed before they are transferred to the back of the glass substrate, or removed immediately if they had been transferred.

EXAMPLE 7

The method described in Example 1 is applied to the cleaning step (S122 in FIGS. 11 and 12) taken after the amorphous silicon film 10*a* is formed. The treating apparatus, the conditions for cleaning, and so forth are the same as those in Example 6.

As the result, like Example 6, it is possible to prevent the roller marks from forming.

EXAMPLE 8

The method described in Example 1 is applied to the step of cleaning the polycrystalline silicon film 10*b* (S124 in FIGS. 11 and 12). The treating apparatus, the conditions for cleaning, and so forth are the same as those in Example 6.

As the result, like Example 6, it is possible to prevent the roller marks from forming.

EXAMPLE 9

The method described in Example 1 is applied to the cleaning step (S126 in FIGS. 11 and 12) taken after the gate insulation film 11 is formed. For example, a silicon oxide film formed by the well known process plasma TEOS CVD is used as the gate insulation film 11. The treating apparatus, the conditions for cleaning, and so forth are the same as those in Example 6.

As the result, like Example 6, it is possible to prevent the roller marks from forming.

EXAMPLE 10

The method described in Example 1 is applied to the step of cleaning the gate insulation film 11 surface (S128 in FIGS. 11 and 12) after the gate electrode 12 is formed. For example, a silicon oxide film formed by the well known process plasma TEOS CVD is used as the gate insulation film 11. The treating apparatus, and the conditions for cleaning, and so forth are the same as those in Example 6.

As the result, like Example 6, it is possible to prevent the roller marks from forming.

EXAMPLE 11

The method described in Example 1 is applied to the cleaning step (S131 in FIGS. 11 and 12) taken after the interlayer insulation film 16 is formed. For example a silicon oxide film formed by the well known process plasma TEOS CVD is used as the interlayer insulation film 16. The treating apparatus, the conditions for cleaning, and so forth were the same as those in Example 6.

As the result, like Example 6, it is possible to prevent the roller marks from forming.

EXAMPLE 12

Figure 9:
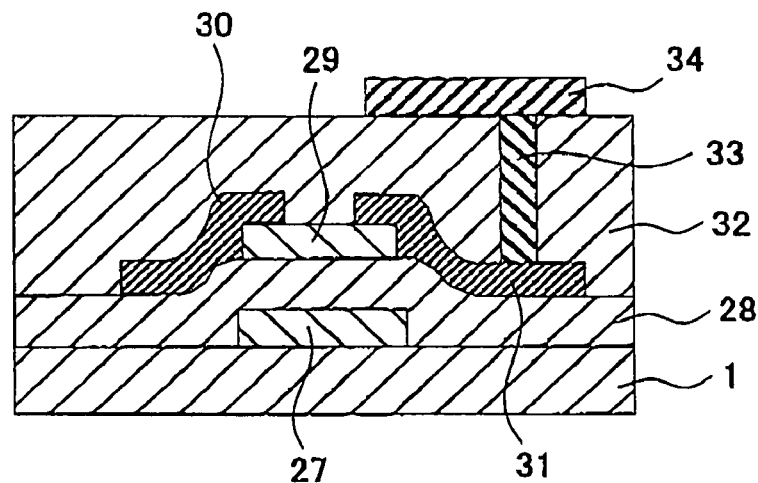
FIG. 9 is a sectional view of an example of an amorphous silicon TFT device manufactured by the manufacturing apparatus according to the present invention.

FIG. 9 shows a sectional device structure of an amorphous silicon TFT. On a glass substrate 1, a gate electrode 27, a gate insulation film 28 and an amorphous silicon film 29 are formed in this order by a well known process, and thereafter the amorphous silicon film 29 is worked in predetermined shapes to form a source electrode 30 and a drain electrode 31. Then, a protective film 32 is so formed as to cover the amorphous silicon film 29, source electrode 30 and drain electrode 31. On this protective film 32, an ITO electrode 34 is formed through a contact hole 33 for making contact with the drain electrode 31 to complete the amorphous silicon TFT.

It also often takes place that silicon nitride films or silicon oxide films are used as gate insulation films 28 or protective films 32 and contact holes 33 are formed by a wet process. Accordingly, the contact holes 33 is formed in the protective film 32 by the method described in Example 1. As the result, the insoluble residues is seen to form when the contact holes 33 is formed, which, however, is not seen to form as roller marks on the back of the glass substrate 1.

EXAMPLE 13

Figure 10:
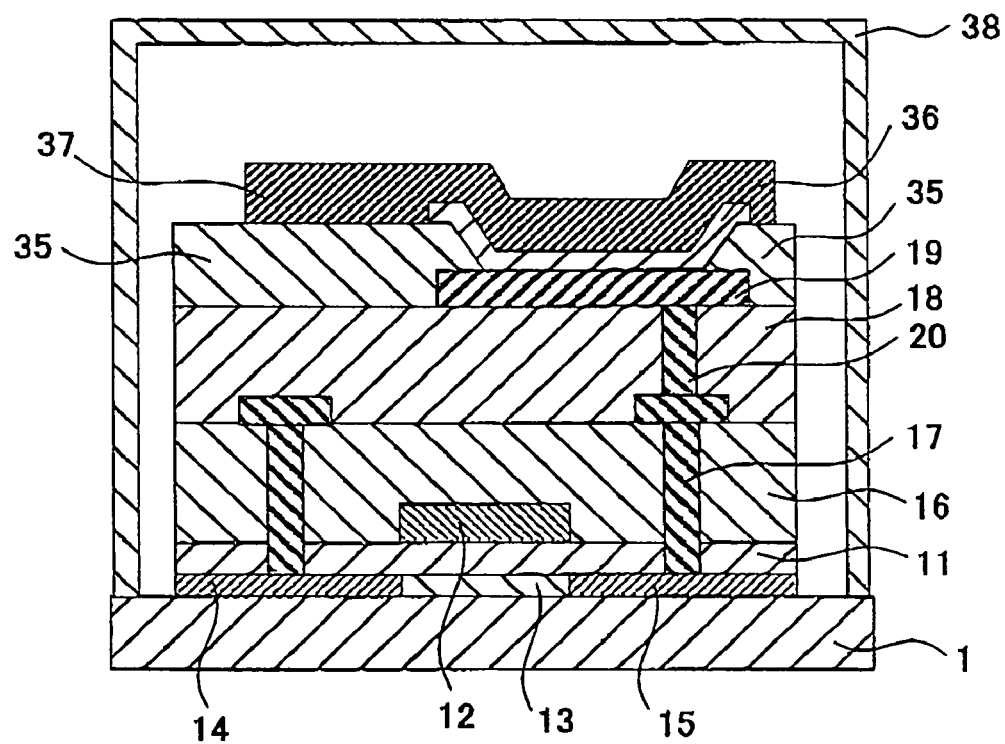
FIG. 10 is a sectional view of an example of an organo-EL display device manufactured by the manufacturing apparatus according to the present invention.

FIG. 10 shows a sectional device structure of an organo-EL (electroluminescence) display device. On a glass substrate 1, a polycrystalline silicon film 10b and up to an ITO electrode 19 are formed in the same manner as those shown in FIGS. 6A to 6D, and an insulation film 35 is formed thereon. A contact hole for making contact with the ITO electrode 19 is formed in the insulation film 35, and, at that position, an organo-EL layer 36 is formed and then a cathode 37 is formed. These are further sealed with a sealing cap 38 to complete the organo-EL display device.

It also often takes place that silicon nitride films or silicon oxide films are used as insulation films 35 and contact holes are formed by a wet process.

Accordingly, the contact holes can be formed in the protective film 35 by the method described in Example 1. As the result, the insoluble residues is seen to form when the contact holes is formed, which, however, is not seen to form as roller marks on the back of the glass substrate 1.

In the foregoing Example 1 to Example 13, rollers are used as the supporting members 6, which, however, are not necessarily limited thereto, and belts or the like may also be used as long as they can transport the glass substrate by the flat-flow system.

As described hereinbefore, in carrying out treatment using the solution which dissolves the glass substrate, the insoluble residues having reacted with the solution may be kept from adhering to the glass substrate, whereby the roller marks forming as the rollers support the glass substrate can effectively be kept from forming on the back of the substrate. As the result, this makes it possible to prevent display performance from being lowered which display devices making use of glass substrates should have.

In the foregoing, the thin film is treated with the first solution while the second solution is supplied to the supporting members or the regions where the supporting members and the substrate come into contact. Instead, after the thin film has been treated with the first solution, the second solution may be supplied to the supporting members or the regions where the supporting members and the substrate come into contact.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A method for manufacturing a display device, comprising:
    a first step of forming a thin film on an upper surface of a glass substrate; and
    a second step of treating the thin film formed on the upper surface of the glass substrate with use of a first solution while the glass substrate is transported by transport rollers with which a lower surface of the glass substrate comes into contact, wherein the second step is performed:
    by arranging each of nozzles corresponding to the transport rollers respectively beneath one of the transport rollers corresponding thereto; and
    by jetting a second solution from said each of the nozzles directly and concentratedly onto the one of the transport rollers corresponding thereto so that the second solution is supplied to the lower surface of the glass substrate via the one of the transport rollers corresponding thereto.

2. The display device manufacturing method according to claim 1, wherein a distance between the each of nozzles and the one of the transport rollers corresponding to and disposed beneath the each of nozzles, is set in a range from 5 mm to 100 mm in the second step.

3. The display device manufacturing method according to claim 2, wherein the second solution is sprayed from the each of the nozzles at a flow rate within the range of from 0.3 liter to 5 liters per minute in the second step.

4. The display device manufacturing method according to claim 1, wherein the second solution is sprayed from the each of the nozzles at a flow rate within the range of from 0.3 liter to 5 liters per minute in the second step.

5. The display device manufacturing method according to claim 1, wherein the first step comprises a step of forming a silicon oxide film on the upper surface of the glass substrate, and the second step is a step of etching the silicon oxide film.

6. The display device manufacturing method according to claim 1, wherein the first step comprises a step of forming a silicon oxide film on the upper surface of the glass substrate, and the second step is a step of cleaning the surface of the silicon oxide film.

7. The display device manufacturing method according to claim 1, wherein the first solution and the second solution are of the same type.

8. The display device manufacturing method according to claim 1, wherein the first solution contains at least hydrogen fluoride or ammonium fluoride.

9. The display device manufacturing method according to claim 1, wherein the first solution and the second solution are of different types.

10. The display device manufacturing method according to claim 1, wherein the first solution contains at least hydrogen fluoride or ammonium fluoride and the second solution is pure water.

11. A method of manufacturing a display device, comprising:
   a first step of forming a thin film on an upper surface of a glass substrate; and
   a second step of treating the thin film formed on the upper surface of the glass substrate with use of a first solution while the glass substrate is transported by transport rollers with which a lower surface of the glass substrate comes into contact, wherein the second step is performed:
   by arranging nozzles below the transport rollers so that each of the nozzles is positioned to be shifted from one of the transport rollers corresponding thereto in a transport direction of the glass substrate by the transport rollers; and
   by jetting a second solution from each of nozzles along a direction inclined with respect to the lower surface of the glass substrate directly and concentratedly onto the one of the transport rollers corresponding thereto and a region where the lower surface of the glass substrate and the one of the transport rollers corresponding thereto come into contact.

12. The display device manufacturing method according to claim 11, wherein a distance between (a) the each of the nozzles and (b) the region where the one of the transport rollers corresponding thereto and the lower surface of the glass substrate come into contact, is set in a range from 5 mm to 100 mm in the second step.

13. The display device manufacturing method according to claim 12, wherein the second solution is sprayed from the each of the nozzles at a flow rate within the range of from 0.3 liter to 5 liters per minute in the second step.

14. The display device manufacturing method according to claim 11, wherein the second solution is jetted in a direction opposite to the direction of transport of the glass substrate.

15. A method for manufacturing a display device, comprising:
   a first step of forming a thin film on an upper surface of a glass substrate; and
   a second step of treating the thin film formed on the upper surface of the glass substrate with use of a first solution while the glass substrate is transported by transport rollers with which a lower surface of the glass substrate comes into contact; wherein the second step is performed:
   by arranging nozzles below the glass substrate so that each of the nozzles is positioned to be shifted from one of the transport rollers corresponding thereto; and
   by jetting a second solution from each of the nozzles along a direction inclined with respect to the lower surface of the glass substrate directly and concentratedly onto a region where the lower surface of the glass substrate and the one of the transport rollers corresponding thereto come into contact.

16. The display device manufacturing method according to claim 15, wherein a distance between (a) the each of the nozzles and (b) the region where the one of the transport rollers corresponding thereto and the lower surface of the glass substrate come into contact, is set in a range from 5 mm to 100 mm in the second step.

17. The display device manufacturing method according to claim 16, wherein the second solution is sprayed from the each of the nozzles at a flow rate within the range of from 0.3 liter to 5 liters per minute in the second step.

18. The display device manufacturing method according to claim 15, wherein the second solution is sprayed from the each of the nozzles at a flow rate within the range of from 0.3 liter to 5 liters per minute in the second step.

* * * * *

UNITED STATES PATENT AND TRADEMARK OFFICE
CERTIFICATE OF CORRECTION

PATENT NO. : 7,119,027 B2 Page 1 of 1
APPLICATION NO. : 10/752571
DATED : October 10, 2006
INVENTOR(S) : T. Ohsawa et al.

It is certified that error appears in the above-identified patent and that said Letters Patent is hereby corrected as shown below:

Title page, item [73]

Add the additional Assignee to the patent at section (73):

--Hitachi, Ltd., Tokyo (JP)--

Signed and Sealed this

Twenty-ninth Day of January, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,119,027 B2 | Page 1 of 1 |
| APPLICATION NO. | : 10/752571 | |
| DATED | : October 10, 2006 | |
| INVENTOR(S) | : T. Ohsawa et al. | |

It is certified that error appears in the above-identified patent and that said Letters Patent is hereby corrected as shown below:

Title page, item [73] delete "Hitachi, Ltd., Tokyo (JP)"

Signed and Sealed this
Twenty-first Day of February, 2012

David J. Kappos
*Director of the United States Patent and Trademark Office*